(12) United States Patent
Schmitt et al.

(10) Patent No.: US 7,796,418 B2
(45) Date of Patent: Sep. 14, 2010

(54) PROGRAMMABLE MEMORY CELL

(75) Inventors: Jonathan Schmitt, Eden Prairie, MN (US); Joseph Glenn, Eden Prairie, MN (US); Douglas Smith, Mesa, AZ (US); Myron Buer, Gilbert, AZ (US)

(73) Assignee: Broadcom Corporation, Irvine, CA (US)

( * ) Notice: Subject to any disclaimer, the term of this patent is extended or adjusted under 35 U.S.C. 154(b) by 261 days.

(21) Appl. No.: 12/077,600

(22) Filed: Mar. 19, 2008

(65) Prior Publication Data

US 2009/0237974 A1    Sep. 24, 2009

(51) Int. Cl.
*G11C 11/00* (2006.01)
(52) U.S. Cl. .................. 365/154; 365/175; 365/96; 365/185.07; 365/185.24; 365/225.7
(58) Field of Classification Search .................. 365/154, 365/175, 96, 185.07, 185.24, 225.7
See application file for complete search history.

(56) References Cited

U.S. PATENT DOCUMENTS

| | | | | |
|---|---|---|---|---|
| 4,764,897 A * | 8/1988 | Kameyama et al. | ......... | 365/154 |
| 5,490,105 A * | 2/1996 | Chandna et al. | ............. | 365/156 |
| 5,986,923 A * | 11/1999 | Zhang et al. | ................. | 365/154 |
| 6,104,631 A * | 8/2000 | El-Sharawy et al. | ........ | 365/154 |
| 6,301,147 B1 * | 10/2001 | El-Sharawy et al. | ........ | 365/154 |
| 6,603,345 B2 * | 8/2003 | Takahashi | ................... | 327/534 |
| 6,643,173 B2 * | 11/2003 | Takemura | .............. | 365/185.05 |
| 7,002,829 B2 * | 2/2006 | Singh et al. | .................... | 365/96 |
| 7,110,317 B2 * | 9/2006 | Song et al. | ................... | 365/226 |
| 7,164,616 B2 * | 1/2007 | Miller et al. | ............. | 365/230.06 |
| 7,177,182 B2 * | 2/2007 | Diorio et al. | ........... | 365/185.01 |
| 7,221,611 B2 * | 5/2007 | Han et al. | .................... | 365/226 |
| 7,242,600 B2 * | 7/2007 | Phan et al. | ................ | 365/49.15 |
| 7,342,836 B2 * | 3/2008 | Taheri et al. | ........... | 365/189.05 |
| 7,345,947 B2 * | 3/2008 | Miller et al. | ........... | 365/230.06 |
| 7,372,764 B2 * | 5/2008 | Nautiyal et al. | ............. | 365/229 |
| 7,477,552 B2 * | 1/2009 | Haid et al. | ............. | 365/189.09 |
| 2007/0047364 A1 * | 3/2007 | Chuang et al. | .............. | 365/226 |

* cited by examiner

*Primary Examiner*—Viet Q Nguyen
(74) *Attorney, Agent, or Firm*—Farjami & Farjami LLP

(57) ABSTRACT

A disclosed embodiment is a programmable memory cell comprising an elevated ground node having a voltage greater than a common ground node by an amount substantially equal to a voltage drop across a trigger point adjustment element. In one embodiment, the trigger point adjustment element can be a diode. The trigger voltage of the programmable memory cell is raised closer to a supply voltage when current passes through the trigger point adjustment element during a write operation. The programmable memory cell can comprise a pair of cross-coupled inverters, and first and second programmable antifuses that can be coupled to each inverter in the pair of cross-coupled inverters. Since the trigger voltage of the programmable memory cell is raised closer to the supply voltage, a programmed antifuse can easily reach below the trigger voltage and result in a successful write operation even when the supply voltage is a low voltage.

18 Claims, 3 Drawing Sheets

PROGRAMMABLE MEMORY CELL

BACKGROUND OF THE INVENTION

1. Field of the Invention

The present invention is generally in the field of memory cells. More particularly, the present invention relates to programmable memory cells.

2. Background Art

One type of conventional one-time programmable memory cell is implemented by combining a memory cell and a pair of antifuses. One-time programming the memory cell requires applying a programming voltage to one of the antifuses, until the antifuse permanently shorts to a ground voltage. The antifuse ground voltage is then utilized to perform a write operation to the memory cell. For instance, to write a logical one to the memory cell, the first antifuse can be shorted to ground, while to write a logical zero to the memory cell, the second antifuse can be shorted to ground. After being shorted, the antifuse will not provide a precise ground voltage to the memory cell, because the antifuse will have a residual impedance which may vary, for example, as the antifuse ages.

In the past, antifuse residual impedance was not a significant problem. However, memory cell supply voltages have become lower over time, to provide power-saving and speed advantages. Typically, a memory cell operating between a supply voltage and ground will have a trigger point voltage of less than half the supply voltage. To successfully perform a write operation to the memory cell, the programmed antifuse must provide a voltage lower than the memory cell trigger point voltage. However, if the programmed antifuse has a residual impedance such that it provides a voltage higher than the memory cell trigger voltage, the memory cell write operation will not succeed.

Thus, there is a need in the art for a programmable memory cell that does not suffer from failed write operations.

SUMMARY OF THE INVENTION

A programmable memory cell, substantially as shown in and/or described in connection with at least one of the figures, and as set forth more completely in the claims.

DETAILED DESCRIPTION OF THE INVENTION

The present invention is directed to a programmable memory cell. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention, which use the principles of the present invention are not specifically described in the present application and are not specifically illustrated by the present drawings.

Figure 1:
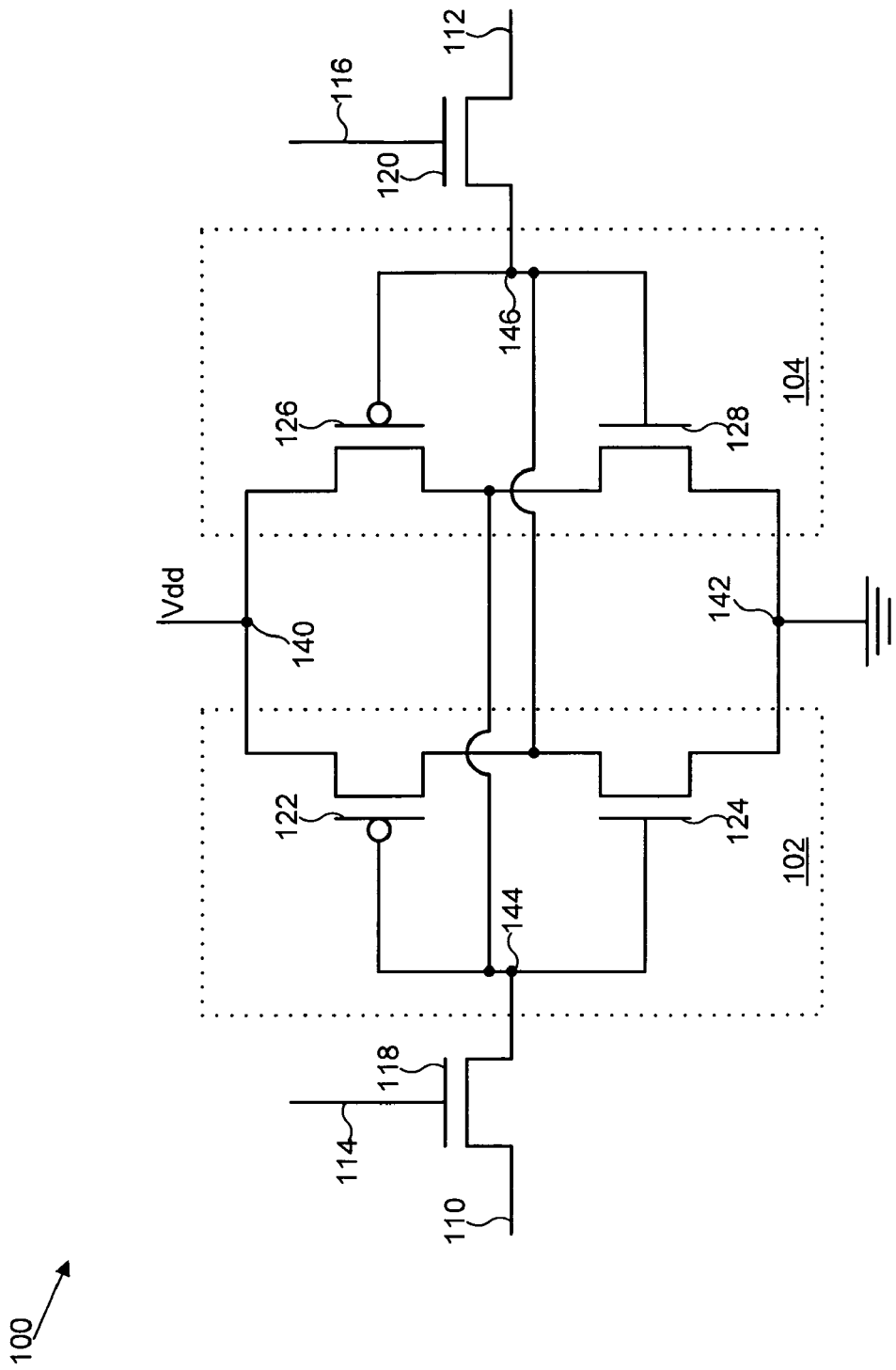
FIG. 1 shows a conventional memory cell.

Conventional memory cell 100 is shown in FIG. 1. Memory cell 100 includes access transistors 118 and 120 and transistors 122, 124, 126, and 128. Transistors 122 and 124 are configured as inverter 102, and transistors 126 and 128 are configured as inverter 104. The output of inverter 102 is connected to the input of inverter 104 at node 146, and the output of inverter 104 is connected to the input of inverter 102 at node 144. Inverters 102 and 104 are thus cross-coupled.

Inverter 102 is connected to Vdd (or "supply voltage") node 140 through transistor 122, which is a P type transistor, and to ground node 142 through transistor 124, which is an N type transistor. Similarly, inverter 104 is connected to Vdd node 140 through transistor 126, which is a P type transistor, and to ground node 142 through transistor 128, which is an N type transistor. Thus, if inverter 104 couples ground node 142 to input node 144 of inverter 102 through transistor 128, inverter 102 must couple Vdd node 140 to input node 146 of inverter 104 through transistor 122. In this mutually-reinforced state, inverters 102 and 104 provide the voltage at Vdd node 140 to node 146, representing a logical one. In the opposite configuration, inverters 102 and 104 provide the voltage at ground node 142 to node 146, representing a logical zero. The logical one or zero stored in inverters 102 and 104 can be accessed for reading by other circuits (not shown) through access transistors 118 and 120.

Conventional memory cell 100 can be read by, for example, pre-charging nodes 110 and 112 and thereafter applying a voltage to gates 114 and 116. If inverters 102 and 104 are holding node 146 at logical one, then the charge on node 110 will drain through access transistor 118 and transistor 124 to ground node 142, while the charge on node 112 will remain unchanged. The remaining charge on node 112 and the depleted charge on node 110 indicate that memory cell 100 is holding a logical one. If inverters 102 and 104 had been in an opposite state, holding logical zero, then node 112 would have drained to ground node 142 instead of node 110.

Conventional memory cell 100 can be written by driving nodes 110 and 112 with the desired logical value to be written, and applying a voltage to gates 114 and 116 of access transistors 118 and 120. For example, to write a logical one, node 110 can be driven to logical zero, node 112 can be driven to logical one, and a voltage can be applied to gates 114 and 116. If memory cell 100 is already holding logical one, no change will occur. However, if memory cell 100 is holding a logical zero, then node 146 will be at a voltage on ground node 142 and node 144 will be at a voltage on Vdd node 140. The driven voltages on nodes 110 and 112 override the stored voltages at nodes 144 and 146, respectively, and flip inverters 102 and 104 to a new state, reflecting the logical one written to memory cell 100.

Figure 2:
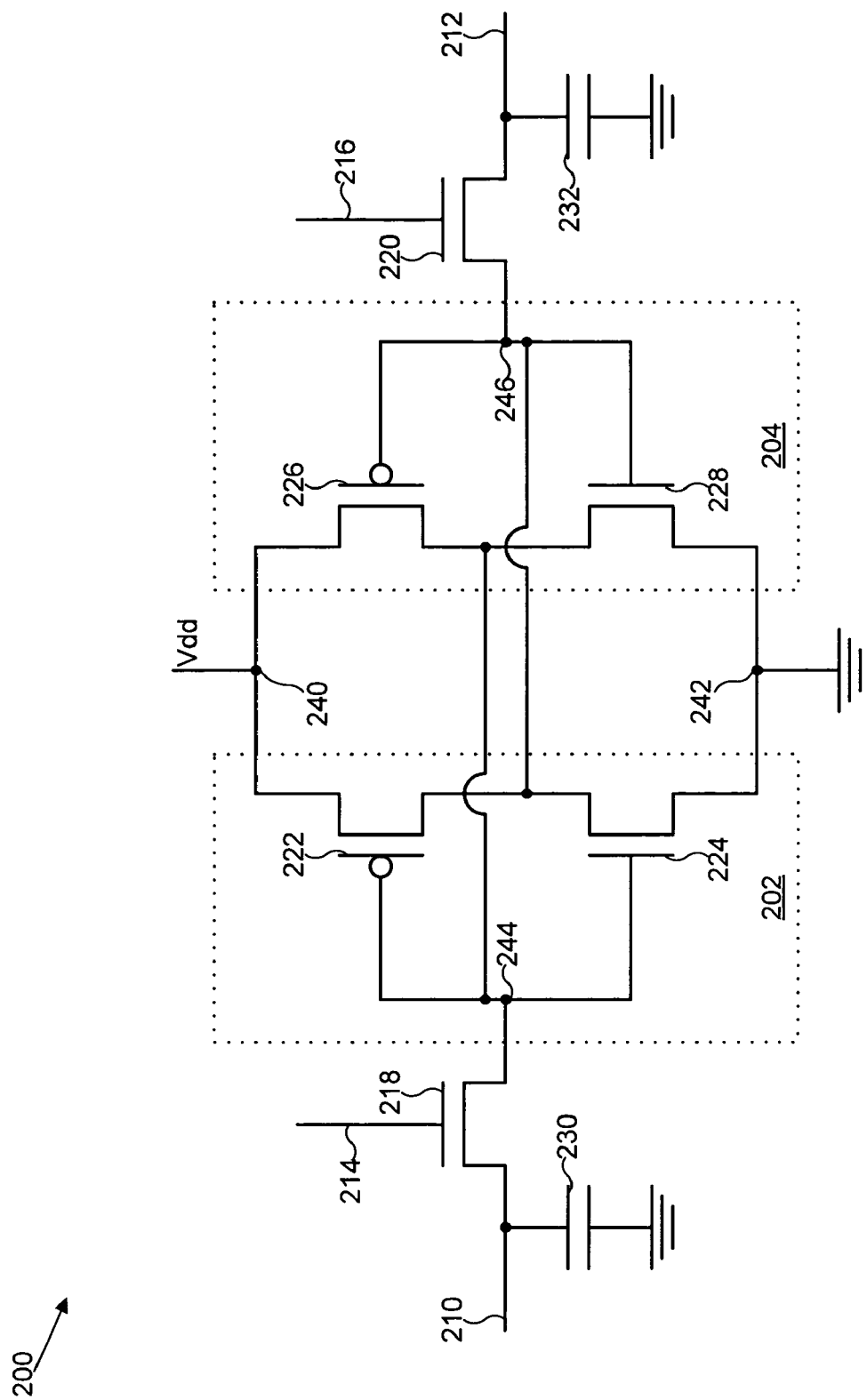
FIG. 2 shows a conventional one-time programmable memory cell.

A conventional one-time programmable memory cell 200 is shown in FIG. 2. Memory cell 200 includes transistors 218 and 220 and transistors 222, 224, 226, and 228, corresponding to transistors 122, 124, 126, and 128 in memory cell 100. Transistors 222 and 224 are configured as inverter 202, corresponding to inverter 102, and transistors 226 and 228 are configured as inverter 204, corresponding to inverter 104. The output of inverter 202 is connected to the input of inverter 204 at node 246, and the output of inverter 204 is connected to the input of inverter 202 at node 244. Inverters 202 and 204 are thus cross-coupled like inverters 102 and 104.

Memory cell 200 includes conventional antifuses 230 and 232. Antifuses 230 and 232, which contain high impedance insulators, do not conduct current prior to being programmed.

By programming antifuse 230 or 232 with a programming voltage, the insulator undergoes break down so that antifuse 230 or 232 is shorted permanently to ground. While programming antifuse 230 or 232, transistor 218 or 220, respectively, is disabled to prevent exposure of inverters 202 and 204 to the programming voltage.

Prior to programming antifuse 230 or 232, memory cell 200 operates in a fashion similar to memory cell 100. A logical value stored on inverters 202 and 204 can be read by read circuitry (not shown) coupled to memory cell 200 through access circuitry not shown in FIG. 2. After programming antifuse 230 or 232, inverters 202 and 204 can be written into by enabling transistors 218 and 220. For example, after programming antifuse 230, transistors 218 and 220 can be enabled by applying a voltage to gates 214 and 216 of transistors 218 and 220. Transistors 218 and 220 are used to write logic values to inverters 202 and 204 based on the states of antifuses 230 and 232. After writing a logic value, transistors 218 and 220 are disabled, and the logic value can be read by read circuitry coupled to memory cell 200 through access circuitry not shown in FIG. 2.

Typically, inverters 202 and 204 have a trigger voltage less than half way between the supply voltage at Vdd node 240 and the ground voltage at ground node 242. In this example, conventional memory cell 200 operates with 1.2 volts at Vdd node 240 and 0 volts at ground node 242, and inverters 202 and 204 might have a trigger voltage of approximately 0.3 volts. Thus, to write a logical one to inverters 202 and 204, node 244 must be pulled below 0.3 volts. Conversely, to write a logical zero to inverters 202 and 204, node 246 must be pulled below 0.3 volts. Operating with a Vdd voltage of 1.2 volts can provide power savings and speed advantages, but the 0.3-volt trigger voltage can lead to write operation failures, as discussed below.

To write a logical one to memory cell 200, antifuse 230 is programmed with the goal of shorting node 210 to ground, while antifuse 232 is left unprogrammed. The impedance of antifuse 230 is thus substantially and permanently reduced. However, the impedance of antifuse 230 will not be zero for several reasons. For example, imprecision in manufacturing processes leads to physical differences in each produced antifuse. As another example, using a higher programming voltage may damage other components of memory cell 200, such as transistor 218, and consequently the programming voltage for antifuse 230 is typically lower than the voltage required to burn a zero impedance into antifuse 230. Because antifuse 230 retains a residual impedance after being programmed, antifuse 230 results in a voltage drop of, for example, 0.6 volts between node 210 and ground.

After programming antifuse 230, the process of writing a logical one to memory cell 200 continues by applying a voltage to gates 214 and 216 of transistors 218 and 220. Transistors 218 and 220 are thereby enabled, coupling programmed antifuse 230 to node 244 and unprogrammed antifuse 232 to node 246. If memory cell 200 is presently storing a logical one, then node 244 is coupled to ground node 242 through transistor 228, while node 246 is coupled to Vdd node 240 through transistor 222, and no change need occur for the write operation to succeed. In contrast, if memory cell 200 is presently storing a logical zero, then node 244 is instead coupled to Vdd node 240 through transistor 226. The voltage at node 244 must be pulled down to a ground voltage, i.e. pulled down below the trigger voltage of inverters 202 and 204, for the write operation to succeed. However, antifuse 230 cannot pull node 244 down to the ground voltage because, in the present example, 0.6 volts is above the trigger voltage, 0.3 volts, of inverters 202 and 204. Consequently, the logical one will not be written, and subsequent read operations will be incorrect.

Figure 3:
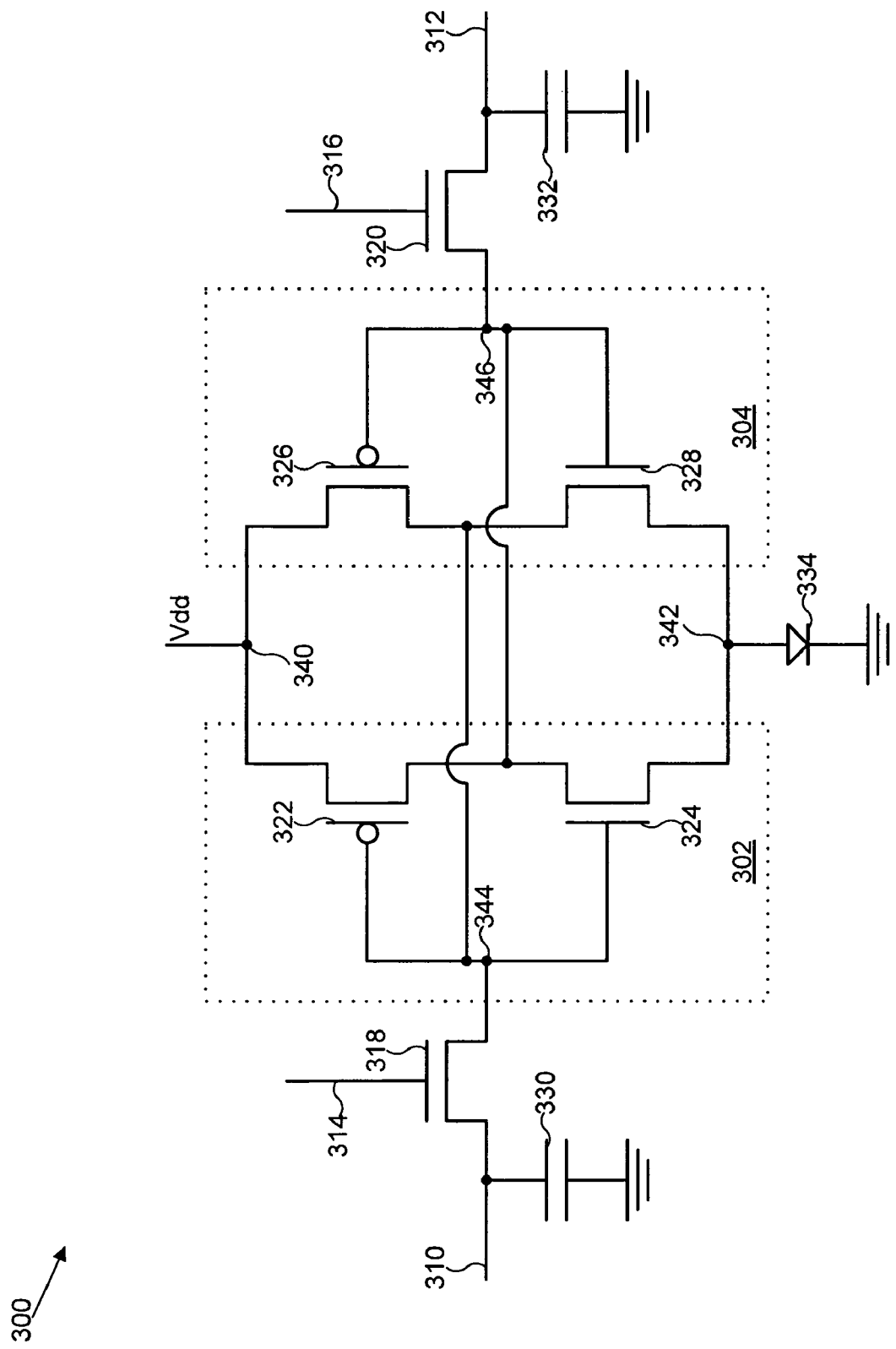
FIG. 3 shows a one-time programmable memory cell, according to one embodiment of the present invention.

FIG. 3 shows one-time programmable memory cell 300 according to one embodiment of the invention. Memory cell 300 includes transistors 318 and 320 and transistors 322, 324, 326, and 328. Transistors 322 and 324 are configured as inverter 302 and transistors 326 and 328 are configured as inverter 304. The output of inverter 302 is connected to the input of inverter 304 at node 346, and the output of inverter 304 is connected to the input of inverter 302 at node 344. Inverters 302 and 304 are thus cross-coupled.

In the present embodiment of the invention, memory cell 300 includes diode 334, which is coupled between node 342 and ground. Diode 334 is an example of a device or element that is used in the invention to increase the trigger voltage or trigger point of memory cell 300. Thus, in general, diode 334 can be replaced by another device or element referred to as a "trigger point adjustment element" in the present application. For example, in other embodiments of the invention, the trigger point adjustment element might be implemented as, for example, an N type transistor with a gate coupled to node 342, a P type transistor with a gate coupled to ground, a resistor, or a combination or a variation of these devices.

In the present application, node 342 is also referred to as an "elevated ground node" since it has a voltage greater than the common ground in FIG. 3, and node 342 is used to effectively increase ground potential for inverters 302 and 304 in memory cell 300. In the present embodiment, diode 334 provides a voltage at elevated ground node 342 that is raised above the common ground voltage by an amount substantially equal to a voltage drop across diode 334. A voltage drop can occur across diode 334 when current flows through diode 334 during a memory cell 300 write operation. For example, in one embodiment, the amount of the voltage drop across diode 334 might be approximately 0.4 volts, and consequently the voltage at elevated ground node 342 might be approximately 0.4 volts.

Memory cell 300 includes conventional antifuses 330 and 332. Antifuses 330 and 332, which contain high impedance insulators, do not conduct current prior to being programmed. It is noted that the invention is not limited to a particular implementation of antifuses. Moreover, instead of using antifuses, other embodiments might use fuses (which, in contrast to antifuses, conduct current prior to being programmed, and achieve high impedance after being programmed). By programming antifuse 330 or 332 with a programming voltage, which in one embodiment might be approximately 5 volts, the antifuse's insulator can undergo break down so that antifuse 330 or 332 is shorted permanently to ground. While programming antifuse 330 or 332, transistor 318 or 320, respectively, is disabled to prevent exposure of inverters 302 and 304 to the programming voltage.

Prior to programming antifuse 330 or 332, memory cell 300 can operate as an ordinary memory cell, and a logical value stored on inverters 302 and 304 can be read by read circuitry (not shown) coupled to memory cell 300 through access circuitry not shown in FIG. 3. After programming antifuse 330 or 332, inverters 302 and 304 can be written into by enabling transistors 318 and 320. For example, after programming antifuse 330, transistors 318 and 320 can be enabled by applying a voltage to gates 314 and 316, thereby coupling antifuses 330 and 332 to inverters 302 and 304. After writing a logic value, transistors 318 and 320 are disabled, and the logic value can be read by read circuitry coupled to memory cell 300 through access circuitry not shown in FIG. 3.

Typically, inverters 302 and 304 have a trigger voltage that is less than half way between the supply voltage at Vdd node 340 and the voltage at elevated ground node 342. By way of example, inverters 302 and 304 might have a trigger voltage of approximately 0.7 volts, which is approximately 0.3 volts higher than the 0.4 volts at elevated ground node 342. Notably, the 0.7-volt trigger voltage is significantly higher than the trigger voltage of inverters 202 and 204 in conventional memory cell 200. Thus, to write a logical one to inverters 302 and 304, node 344 must be pulled below 0.7 volts, and to write a logical zero to inverters 302 and 304, node 346 must be pulled below 0.7 volts. Operating with a Vdd voltage of 1.2 volts, power savings and speed advantages can be preserved while the 0.7-volt trigger voltage of memory cell 300 ensures that the write operations succeed, as discussed further below.

To write a logical one to memory cell 300, antifuse 330 is programmed with the goal of shorting node 310 to ground, and antifuse 332 is left unprogrammed. The impedance of antifuse 330 is thus substantially and permanently reduced. However, the impedance of antifuse 330 will not be zero for several reasons. For example, imprecision in manufacturing processes leads to physical differences in each produced antifuse. As another example, using a higher programming voltage may damage other components of memory cell 300, such as transistor 318, and consequently the programming voltage for antifuse 330 is typically lower than that voltage required to burn a zero impedance into antifuse 330. Because antifuse 330 retains a residual impedance after being programmed, antifuse 330 results in a voltage drop of, for example, 0.6 volts between node 310 and ground.

After programming antifuse 330, the process of writing a logical one to memory cell 300 continues by applying a voltage to gates 314 and 316 of transistors 318 and 320. Transistors 318 and 320 are thereby enabled, coupling programmed antifuse 330 to node 344 and unprogrammed antifuse 332 to node 346. If memory cell 300 is presently storing a logical one, then node 344 is coupled to elevated ground node 342 through transistor 328, while node 346 is coupled to Vdd node 340 through transistor 322, and no change need occur for the write operation to succeed.

In contrast, if memory cell 300 is presently storing a logical zero, then node 344 is instead coupled to Vdd node 340 through transistor 326. The voltage at node 344 must be pulled down below the trigger voltage of inverters 302 and 304, for the write operation to succeed. Because diode 334 has elevated the trigger voltage of memory cell 300 to 0.7 volts, programmed antifuse 330, even with the 0.6-volt drop between node 310 and ground, can pull node 344 below the 0.7-volt trigger voltage. Consequently, the logical one will be written to memory cell 300, and subsequent read operations will be correct. As illustrated by way of the above examples, memory cell 300 discussed above as one exemplary embodiment of the invention, results in successful and reliable write operations while preserving the speed and power saving advantages resulting from using lower Vdd supply voltages.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a programmable memory cell has been described.

The invention claimed is:

1. A programmable memory cell comprising:
an elevated ground node having a voltage greater than a common ground node by an amount substantially equal to a voltage drop across a trigger point adjustment element, whereby a trigger voltage of said programmable memory cell is raised closer to a supply voltage when current passes through said trigger point adjustment element during a write operation.

2. The programmable memory cell of claim 1, wherein the trigger point adjustment element is a diode.

3. The programmable memory cell of claim 1, further comprising a programmable antifuse.

4. The programmable memory cell of claim 3, wherein programming said programmable antifuse substantially reduces an impedance of said programmable antifuse.

5. The programmable memory cell of claim 3, wherein programming said programmable antifuse requires applying a programming voltage greater than said supply voltage to said programmable antifuse.

6. The programmable memory cell of claim 1, further comprising a first inverter.

7. The programmable memory cell of claim 6, further comprising a second inverter cross-coupled with said first inverter.

8. The programmable memory cell of claim 7, further comprising a first transistor configured to electrically couple a first programmable antifuse to said first inverter.

9. The programmable memory cell of claim 8, further comprising a second transistor configured to electrically couple a second programmable antifuse to said second inverter.

10. The programmable memory cell of claim 1, wherein said trigger point adjustment element is selected from the group consisting of a resistor, an N type transistor, and a P type transistor.

11. A programmable memory cell comprising:
a pair of cross-coupled inverters coupled between a supply voltage and an elevated ground node;
said elevated ground node having a voltage greater than a common ground node by an amount substantially equal to a voltage drop across a trigger point adjustment element, whereby a trigger voltage of said pair of cross-coupled inverters is raised closer to said supply voltage when current passes through said trigger point adjustment element during a write operation.

12. The programmable memory cell of claim 11, wherein the trigger point adjustment element is a diode.

13. The programmable memory cell of claim 11, further comprising a programmable anti fuse.

14. The programmable memory cell of claim 13, wherein programming said programmable antifuse substantially reduces an impedance of said programmable antifuse.

15. The programmable memory cell of claim 13, wherein programming said programmable antifuse requires applying a programming voltage greater than said supply voltage to said programmable antifuse.

16. The programmable memory cell of claim 11, further comprising a first transistor configured to electrically couple a first programmable antifuse to a first inverter in said pair of cross-coupled inverters.

17. The programmable memory cell of claim 16, further comprising a second transistor configured to electrically couple a second programmable antifuse to a second inverter in said pair of cross-coupled inverters.

18. The programmable memory cell, of claim 11, wherein said trigger point adjustment element is selected from the group consisting of a resistor, an N type transistor, and a P type transistor.

* * * * *